United States Patent
Hu et al.

(10) Patent No.: US 10,262,615 B2
(45) Date of Patent: Apr. 16, 2019

(54) SHIFT REGISTER, DRIVING METHOD, AND GATE ELECTRODE DRIVE CIRCUIT

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Like Hu, Beijing (CN); Haigang Qing, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 0 days.

(21) Appl. No.: 15/508,921

(22) PCT Filed: May 20, 2016

(86) PCT No.: PCT/CN2016/082902
§ 371 (c)(1),
(2) Date: Mar. 4, 2017

(87) PCT Pub. No.: WO2017/117895
PCT Pub. Date: Jul. 13, 2017

(65) Prior Publication Data
US 2018/0301101 A1    Oct. 18, 2018

(30) Foreign Application Priority Data
Jan. 5, 2016    (CN) .......................... 2016 1 0006958

(51) Int. Cl.
G09G 3/00    (2006.01)
G09G 3/36    (2006.01)
G11C 19/28   (2006.01)

(52) U.S. Cl.
CPC .......... *G09G 3/3677* (2013.01); *G11C 19/28* (2013.01); *G09G 3/3648* (2013.01);
(Continued)

(58) Field of Classification Search
CPC .. G09G 3/3648; G09G 3/3674; G09G 3/3677; G09G 2310/08; G09G 2310/0283; G09G 2310/0286
See application file for complete search history.

(56) References Cited

U.S. PATENT DOCUMENTS

2006/0001637 A1* 1/2006 Pak ...................... G09G 3/3677
345/100
2010/0002827 A1* 1/2010 Shih ..................... G09G 3/3677
377/57

(Continued)

FOREIGN PATENT DOCUMENTS

| CN | 102467891 A | 5/2012 |
| CN | 104252853 A | 12/2014 |
| CN | 105185290 A | 12/2015 |

OTHER PUBLICATIONS

International Search Report and Written Opinion dated Oct. 13, 2016 in PCT/CN2016/082902.
1st Office Action dated Aug. 1, 2017 in CN201610006958.0.

*Primary Examiner* — Michael J Eurice
(74) *Attorney, Agent, or Firm* — Syncoda LLC; Feng Ma

(57) ABSTRACT

A shift register includes: a plurality of clock signal terminals; and a plurality of input terminals. The plurality input terminals are configured to provide input signals under control by one or more clock signals from one or more of the plurality of clock signal terminals to realize both a forward scan and a backward scan of the shift register.

20 Claims, 9 Drawing Sheets

(52) U.S. Cl.
CPC ... *G09G 3/3674* (2013.01); *G09G 2310/0283* (2013.01); *G09G 2310/0286* (2013.01); *G09G 2310/06* (2013.01); *G09G 2310/08* (2013.01)

(56) References Cited

U.S. PATENT DOCUMENTS

| | | | | |
|---|---|---|---|---|
| 2010/0177023 | A1* | 7/2010 | Han | G11C 19/184 |
| | | | | 345/76 |
| 2012/0105393 | A1* | 5/2012 | Tan | G09G 3/3677 |
| | | | | 345/204 |
| 2012/0105397 | A1* | 5/2012 | Tan | G09G 3/3677 |
| | | | | 345/205 |
| 2012/0113088 | A1* | 5/2012 | Han | G09G 3/3674 |
| | | | | 345/212 |
| 2012/0188210 | A1* | 7/2012 | Zhang | G09G 3/3677 |
| | | | | 345/204 |
| 2013/0241814 | A1* | 9/2013 | Hirabayashi | G09G 3/3677 |
| | | | | 345/100 |
| 2014/0071104 | A1* | 3/2014 | Gao | G11C 19/28 |
| | | | | 345/208 |
| 2014/0118237 | A1* | 5/2014 | Wang | G11C 19/28 |
| | | | | 345/100 |
| 2014/0119491 | A1* | 5/2014 | Liu | G11C 19/28 |
| | | | | 377/64 |
| 2014/0126684 | A1* | 5/2014 | Ma | G11C 19/287 |
| | | | | 377/64 |
| 2014/0159999 | A1* | 6/2014 | Gu | G11C 19/28 |
| | | | | 345/100 |
| 2015/0279481 | A1* | 10/2015 | Sasaki | G11C 19/184 |
| | | | | 377/69 |
| 2016/0372070 | A1 | 12/2016 | Hu et al. | |

* cited by examiner

SHIFT REGISTER, DRIVING METHOD, AND GATE ELECTRODE DRIVE CIRCUIT

CROSS-REFERENCE TO RELATED APPLICATION

The present application claims priority to Chinese Patent Application No. 201610006958.0 filed on Jan. 5, 2016, the disclosure of which is hereby incorporated by reference in its entirety.

TECHNICAL FIELD

The present disclosure relates to the field of display technologies, and more specifically to a shift register, its driving method, and a gate electrode drive circuit.

BACKGROUND

With the technological advances in the modern era, liquid crystal displays (LCD) have been widely employed in electronic display products, such as televisions, computers, cellular phones, and personal digital assistants. An LCD comprises source drivers, gate drivers, and an LCD panel, etc. The LCD panel comprises a pixel array. The gate drivers are employed to sequentially turn on corresponding pixel rows in the pixel array, so as to transmit the pixel data output from the source drivers to pixels to display images.

At present, gate drivers are generally formed through an array process, e.g. gate driver on array (GOA) process, over an array substrate of the LCD. This process can help reduce the cost of fabrication, and also can achieve an aesthetic symmetrical design for LCDs. The wire distribution space can also be saved in the bonding areas and fan-out areas of the gate integrated circuit (IC). As such, a narrow-boarder design can be achieved. Meanwhile, this fabrication process can also do away with the bonding process along the gate scan line direction, thereby improving the productivity and yield.

SUMMARY

In an aspect, a shift register is provided, including: a plurality of clock signal terminals; and a plurality of input terminals, wherein the plurality input terminals are configured to provide input signals under control by one or more clock signals from one or more of the plurality of clock signal terminals to realize both a forward scan and a backward scan of the shift register.

In some embodiments, the shift register further includes: a plurality of output terminals; and a plurality of transistor switches configured to alternately pull down or pull up one or more of the plurality of output terminals under control by one or more clock signals from one or more of the plurality of clock signal terminals.

In some embodiments, the plurality of transistor switches comprises: a first transistor switch, a second transistor switch, and a third transistor switch; wherein the first, second, and third transistor switches are configured to alternately pull down one output terminal under control by three clock signals from three clock signal terminals.

In some embodiments, the shift register further includes: a fourth transistor switch; wherein: at least one of the plurality of transistor switches has a size smaller than a size of the fourth transistor switch; and the one or more clock signals are configured to control the plurality of input terminals to thereby provide an increased gate electrode potential to the fourth transistor switch during a second clock pulse width relative to a high gate electrode potential during a first, adjacent, clock pulse, thereby facilitating a fast pull down after a pull up by the fourth transistor switch.

In some embodiments, the shift register further includes a reference signal terminal and a scan signal output terminal.

The plurality of clock signal terminals can include a first clock signal terminal, a second clock signal terminal, and a third clock signal terminal.

The plurality of input terminals can include a first input signal terminal and a second input signal terminal.

The shift register can include a first input circuit, a second input circuit, a drive control circuit, a first output circuit, and a second output circuit.

In some embodiments; a first terminal of the first input circuit is coupled to the first input signal terminal, a second terminal of the first input circuit is coupled to the first clock signal terminal, a third terminal of the first input circuit is coupled to a first node, and the first input circuit is configured to provide signals of the first input signal terminal to the first node under control of a first clock signal from the first clock signal terminal.

In some embodiments, a first terminal of the second input circuit is coupled to the second input signal terminal, a second terminal of the second input circuit is coupled to the third clock signal terminal, a third terminal of the second input circuit is coupled to the first node, and the second input circuit is configured to provide signals of the second input signal terminal to the first node under control of a third clock signal from the third clock signal terminal.

In some embodiments, a first terminal of the drive control circuit is coupled to the first node, a second terminal of the drive control circuit is coupled to a second node, a third terminal of the drive control circuit is coupled to the reference signal terminal, a fourth terminal of the drive control circuit is coupled to the second clock signal terminal, and the drive control circuit is configured to provide signals of the reference signal terminal to the second node under control of the first node, to provide signals of the reference signal terminal to the first node under control of the second node, and to keep a stable voltage difference between the second clock signal terminal and the second node if the second node is in a floating state.

In some embodiments, a first terminal of the first output circuit is coupled to the first node, the second terminal of the first output circuit is coupled to the second clock signal terminal, a third terminal of the first output circuit is coupled to the scan signal output terminal, and the first output circuit is configured to keep a stable voltage difference between the first node and the scan signal output terminal when the first node is in floating state, and to provide signals of the second clock signal terminal to the scan signal output terminal under control of the first node.

In some embodiments, a first terminal of the second output circuit is coupled to the second node, a second terminal of the second output circuit is coupled to the first clock signal terminal, a third terminal of the second output circuit is coupled to the third clock signal terminal, a fourth terminal of the second output circuit is coupled to the reference signal terminal, a fifth terminal of the second output circuit is coupled to the scan signal output terminal, and the second output circuit is configured to provide signals of the reference signal terminal to the scan signal output terminal under control of the second node, the first clock signal terminal, or the third clock signal terminal.

In some embodiments, the second output circuit can include a first sub-circuit, a second sub-circuit, and a third sub-circuit.

In some embodiments, a control terminal of the first sub-circuit is coupled to the second node, an input terminal of the first sub-circuit is coupled to the reference signal terminal, an output terminal of the first sub-circuit is coupled to the scan signal output terminal, and the first sub-circuit is configured to provide signals of the reference signal terminal to the scan signal output terminal under control of the second node.

In some embodiments, a control terminal of the second sub-circuit is connected to the first clock signal terminal, an input terminal of the second sub-circuit is coupled to the reference signal terminal, an output terminal of the second sub-circuit is coupled to the scan signal output terminal, and the second sub-circuit is configured to provide signals of the reference signal terminal to the scan signal output terminal under control of the first clock signal terminal.

In some embodiments, a control terminal of the third sub-circuit is coupled to the third clock signal terminal, an input terminal of the third sub-circuit is connected to the reference signal terminal, an output terminal of the third sub-circuit is coupled to the scan signal output terminal, and the third sub-circuit is configured to provide signals of the reference signal terminal to the scan signal output terminal under control of the third clock signal terminal.

In some embodiments, the first sub-circuit comprises a first transistor switch, wherein: a gate electrode of the first transistor switch is coupled to the second node, a source electrode of the first transistor switch is coupled to the reference signal terminal, and a drain electrode of the first transistor switch is coupled to the scan signal output terminal.

In some embodiments, the second sub-circuit comprises a second transistor switch, wherein a gate electrode of the second transistor switch is coupled to the first clock signal terminal, a source electrode of the second transistor switch is coupled to the reference signal terminal, a drain electrode of the second transistor switch is coupled to the scan signal output terminal.

In some embodiments, the third sub-circuit comprises a third transistor switch, wherein a gate electrode of the third transistor switch is coupled to the third clock signal terminal, a source electrode of the third transistor switch is coupled to the reference signal terminal, a drain electrode of the third transistor switch is coupled to the scan signal output terminal.

In some embodiments, the first output circuit comprises a fourth transistor switch, wherein a gate electrode of the fourth transistor switch is coupled to the first node, a source electrode of the fourth transistor switch is coupled to the second clock signal terminal, and a drain electrode of the fourth transistor switch is coupled to the scan signal output terminal.

In some embodiments, the first output circuit further comprises a first capacitor between the gate electrode and the drain electrode of the fourth transistor switch.

In some embodiments, a size of the first transistor switch, a size of the second transistor switch, and a size of the third transistor switch are all smaller than a size of the fourth transistor switch.

In some embodiments, the first input circuit further comprises a fifth transistor switch; a gate electrode of the fifth transistor switch is coupled to the first clock signal terminal; a source electrode of the fifth transistor switch is coupled to the first input signal terminal; and a drain electrode of the fifth transistor switch is coupled to the first node.

In some embodiments, the second input circuit further comprises a sixth transistor switch; a gate electrode of the sixth transistor switch is coupled to the third clock signal terminal; a source electrode of the sixth transistor switch is coupled to the second input signal terminal; and a drain electrode of the sixth transistor switch is coupled to the first node.

In some embodiments, the drive control circuit comprises a seventh transistor switch and a eighth transistor switch; wherein a gate electrode of the seventh transistor switch is coupled to the first node; a source electrode of the seventh transistor switch is coupled to the reference signal terminal; a drain electrode of the seventh transistor switch is coupled to the second node; a gate electrode of the eighth transistor switch is coupled to the second node; a source electrode of the eighth transistor switch is coupled to the reference signal terminal; and a drain electrode of the eighth transistor switch is coupled to the first node.

In some embodiments, the drive control circuit further comprises a second capacitor between the second node and the second clock signal terminal.

In another aspect, a display apparatus is provided comprising a gate drive circuit including a plurality of shift registers as described above.

In some embodiments, other than a last-stage shift register, a scan signal output terminal of each of the plurality of cascaded shift registers is coupled to a first input signal terminal of a next-stage shift register; other than a first-stage shift register, a scan signal output terminal of each of the plurality of cascaded shift registers is coupled to a second input signal terminal of a last-stage shift register; and a first input signal terminal of the first-stage shift register and a second input signal terminal of the last-stage shift register are both coupled to a frame starting signal terminal.

In some embodiments, a first clock signal terminal of a 3m+1 stage shift register, a second clock signal terminal of a 3m+2 stage shift register, and a third clock signal terminal of a 3m+3 stage shift register are all coupled to a first clock signal terminal to receive a first clock signal.

In some embodiments, a second clock signal terminal of the 3m+1 stage shift register, a third clock signal terminal of the 3m+2 stage shift register, and a first clock signal terminal of the 3m+3 stage shift register are all coupled to a second clock signal terminal to receive a second clock signal.

In some embodiments, a third clock signal terminal of the 3m+1 stage shift register, a first clock signal terminal of the 3m+2 stage shift register, and a second clock signal terminal of the 3m+3 stage shift register are all coupled to a third clock signal terminal to receive a third clock signal; m is an integral between 0 and (N/3−1), N is a total number of shift registers in the gate drive circuit; the first clock signal, the second clock signal, and the third clock signal have a same width of clock cycle, and have a same effective duty cycle of $\frac{1}{3}$; the first clock signal, the second clock signal, and the third clock signal are successively delayed for $\frac{1}{3}$ width of the clock cycle during a forward scan; and the third clock signal, the second clock signal and the first clock signal are successively delayed for $\frac{1}{3}$ width of the clock cycle during a backward scan.

In another aspect, a method is provided for driving a shift register described above, the method comprising an input stage, an output stage, a reset stage, and a hold stage.

In some embodiments, in the input stage, the first input circuit provides signals of the first input signal terminal to the first node under control of the first clock signal terminal;

the drive control circuit provides signals of the reference signal terminal to the second node under control of the first node; and the first output circuit provide signals of the second clock signal terminal to the scan signal output terminal under control of the first node; in the output stage, the drive control circuit provides signals of reference signal terminal to the second node under control of the first node; the first node is in a floating state; the first output circuit keeps a voltage difference between the first node and the scan signal output terminal stable, and provides signals of the second clock signal terminal to the scan signal output terminal under control of the first node; and in the reset stage, the second input circuit provides signals of the second input signal terminal to the first node under control of the the third clock signal terminal; the drive control circuit provides signals of the reference signal terminal to the second node under control of the first node; the first output circuit provides signals of the second clock signal terminal to the scan signal output terminal under control of the first node.

In some embodiments, in the hold stage, the second output circuit provides signals of the reference signal terminal to the scan signal output terminal under control of the first clock terminal.

In some embodiments, the second node is in a floating state, the drive control circuit keeps a voltage difference between the second clock signal terminal and the second node stable; and the second output circuit provides signals of the reference signal terminal to the scan signal output terminal under control of the second node.

In some embodiments, the second output circuit provides signals of the reference signal terminal to the scan signal output terminal under control of the third clock signal terminal.

In another aspect, a method is provided for driving a shift register described above, the method comprising an input stage, an output stage, a reset stage, and a hold stage, wherein: in the input stage, the second input circuit provides signals of the second input signal terminal to the first node under control of the third clock signal terminal; the drive control circuit provides signals of the reference signal terminal to the second node under control of the first node; the first output circuit provide signals of the second clock signal terminal to the scan signal output terminal under control of the first node; in the output stage, the drive control circuit provides signals of reference signal terminal to the second node under control of the first node; the first node is in a floating state, the first output circuit keeps a voltage difference between the first node and the scan signal output terminal stable, and provides signals of the second clock signal terminal to the scan signal output terminal under control of the first node; and in the reset stage, the first input circuit provides signals of the first input signal terminal to the first node under control of the first clock signal terminal; the drive control circuit provides signals of the reference signal terminal to the second node under control of the first node; the first output circuit provides signals of the second clock signal terminal to the scan signal output terminal under control of the first node.

In some embodiments, in the hold stage, the second output circuit provides signals of the reference signal terminal to the scan signal output terminal under control of the third clock terminal.

In some embodiments, the second node is in floating state, the drive control circuit keeps a voltage difference between the second clock signal terminal and the second node stable; and the second output circuit provides signals of the reference signal terminal to the scan signal output terminal under control of the second node.

In some embodiments, the second output terminal provides signals of the reference signal terminal to the scan signal output terminal under control of the first clock signal terminal.

Other embodiments and implementations may become apparent in view of the following descriptions and the attached drawings

BRIEF DESCRIPTION OF THE DRAWINGS

To more clearly illustrate the embodiments of the disclosure, the following is a brief description of the drawings, which are for illustrative purpose only. For those of ordinary skills in the art, other drawings of other embodiments can become apparent based on these drawings.

DETAILED DESCRIPTION

In the following, with reference to the drawings of various embodiments disclosed herein, the technical solutions of the embodiments of the disclosure will be described in a clear and fully understandable way. It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

Existing gate drivers usually comprise a plurality of cascaded shift registers, to thereby realize row-by-row scanning of the gate lines of the display panel. However, these shift registers typically can only achieve one-way scanning. Although some shift registers can achieve two-way scanning, dedicated control signals for controlling the direction of scanning is typically required, which further requires addition of more lines to provide the control signals. This may make it difficult for narrow-boarder designs.

The present disclosure provides a shift register, its driving method, and a gate drive circuit.

According to some embodiments, a first input circuit controls an electric potential at a first node under the control of a first clock signal terminal and a first input signal terminal; a second input circuit controls the electric potential at the first node under the control of a third clock signal terminal and a second input signal terminal; a drive control circuit controls an electric potential at the first node and a second node; a first output circuit controls an electric potential at a scanning signal output terminal under the control of the first node; a second output circuit controls the electric potential at the scanning signal output terminal under the control of the second node, the first clock signal terminal, and the third clock signal terminal.

The first and second input circuits and output circuits, and the drive control circuit can be sub-circuits or units of the shift register, can include one or more circuit elements, or can have modular circuitry formed with IC technologies.

Because the first input terminal and the second input terminal can be designed symmetrically, they can function interchangeably through timing sequence match of the signals of the input signal terminal and the clock signal terminal. The shift register can achieved two-way scanning. No separate scanning direction control signals are necessary as compared with existing technologies, thereby facilitating narrow-boarder designs.

Figure 1:
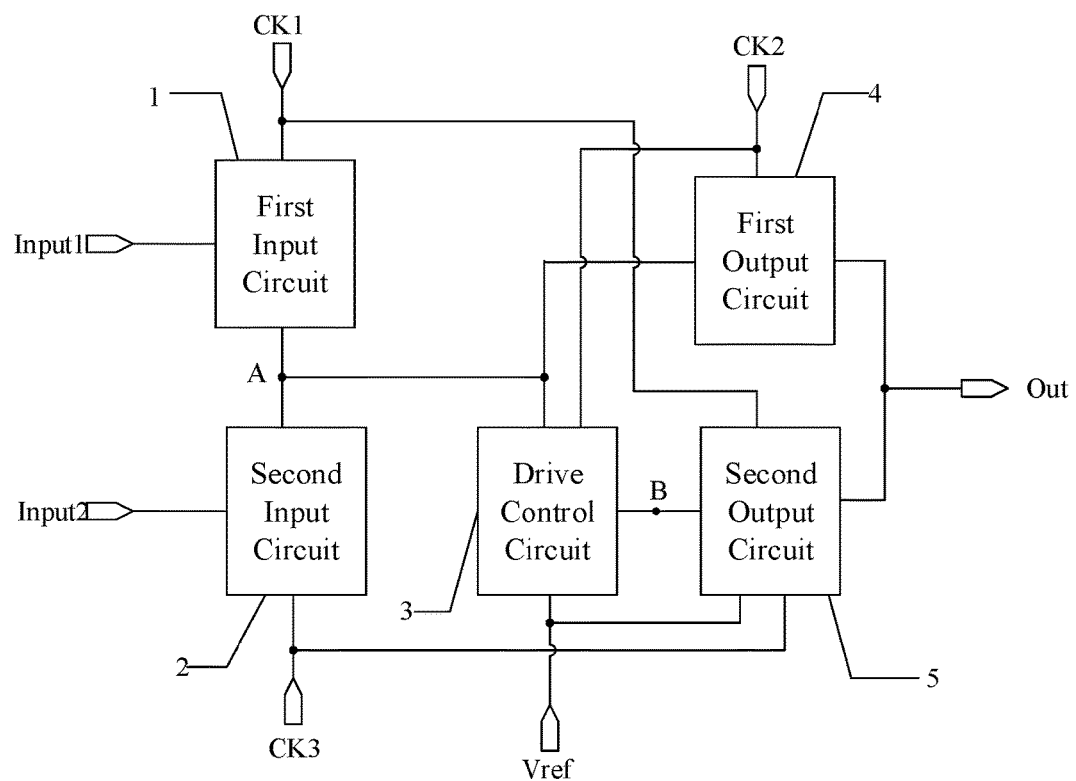
FIG. 1 is a schematic diagram of a shift register according to some embodiments.

A shift register according to some embodiments is illustrated in FIG. 1, comprising: a first input circuit 1, a second input circuit 2, a drive control circuit 3, a first output circuit 4, and a second output circuit 5.

A first terminal of the first input circuit 1 is coupled to the first input signal terminal Input1; a second terminal of the first input circuit 1 is coupled to the first clock signal terminal CK1; a third terminal of the first input circuit 1 is coupled to a first node A; the first input circuit 1 is configured to provide signals from the first input signal terminal Input1 to the first node A under the control of the first clock signal terminal CK1.

A first terminal of the second input circuit 2 is coupled to a second input signal terminal Input2; a second terminal of the second input circuit 2 is coupled to a third clock signal terminal CK3; a third terminal of the second input circuit 2 is coupled to the first node A; the second input circuit 2 is configured to provide signals from the second input signal terminal Input2 to the first node A under the control of the third clock signal terminal CK3.

A first terminal of the drive control circuit 3 is coupled to the first node A; a second terminal of the drive control circuit 3 is coupled to a second node B; a third terminal of the drive control circuit 3 is coupled to a reference signal terminal Vref, a fourth terminal of the drive control circuit 3 is coupled to a second clock signal terminal CK2; the drive control circuit 3 is configured to provide signals from the reference signal terminal Vref to the second node B under the control of first node A, provide the signals from the reference signal terminal Vref to the first node A under the control of the second node B, and maintain a voltage difference between the second clock signal terminal CK2 and the second node B to be stable when the second node B is in a floating state.

A first terminal of a first output circuit 4 is coupled to the first node A; a second terminal of the first output circuit 4 is coupled to the second clock signal terminal CK2; a third terminal of the first output circuit 4 is coupled to a scan signal output terminal Out of the shift register; the first output circuit 4 is configured to maintain a voltage difference between the first node A and the scan signal output terminal Out to be stable if the first node A is in a floating state, and to provide the signals from the second clock signal terminal CK2 to the scan signal output terminal Out under the control of the first node A;

A first terminal of a second output circuit 5 is coupled to the second node B; a second terminal of the second output circuit 5 is coupled to the first clock signal terminal CK1; a third terminal of the second output circuit 5 is coupled to the third clock signal terminal CK3; a fourth terminal of the second output circuit 5 is coupled to the reference signal terminal Vref, a fifth terminal of the second output circuit 5 is coupled to the scan signal output terminal Out; the second output circuit 5 is configured to provide signals from the reference signal terminal Vref to the scan signal output terminal Out under the control of the second node B, the first clock signal terminal CK1, or the third clock signal terminal CK3.

In the shift register according to some embodiments, if the effective pulse signals of the first input signal terminal and the second input signal terminal are both high-potential signals, the electric potential of the reference signal terminal is low; if the effective pulse signals of the first input signal terminal and the second input terminal are both low-potential electric signals, the electric potential of the reference signal terminal is high.

In the shift register according to some embodiments, the clock cycles of the clock signals of the first clock signal terminal, the second clock signal terminal, and the third clock signal terminal have a same width, all having a duty cycle of ⅓; the widths of the effective pulse signals of the first input signal terminal and the second input signal terminal are both equal to ⅓ of the width of the clock cycle of the clock signal.

According to some embodiments, if the effective pulse signals of the first input signal terminal and the second input signal terminal are both high-potential signals, the first clock signal terminal is at a high potential if the first input signal terminal is at a high potential, the second clock signal terminal is at a high potential if the scan signal output terminal is at a high potential, the third clock signal terminal is at a high potential if the second input signal terminal is at a high potential.

If the effective pulse signals of the first input signal terminal and the second input signal terminal are both low-potential signals, the first clock signal terminal is at a low potential if the first input signal terminal is at a low potential, the second clock signal terminal is at a low potential if the scan signal output terminal is at a low potential, the third clock signal terminal is at a low potential if the second input signal terminal is at a low potential.

According to some embodiments, the first input circuit and the second input circuit are symmetrically designed, and thus can be functionally interchanged. As such, two-way scanning can be achieved for the shift register as described above.

During a forward scan, the first input circuit is employed for inputting, and the second input circuit is employed for resetting. Therefore, the effective pulse signal of the second input signal terminal is delayed for ⅔ of the clock cycle compared with the effective pulse signal of the first input signal terminal.

During a backward scan, the functions of the first input circuit and the second input circuit of the shift register are interchanged, i.e., the second input circuit is employed for inputting, and the first input circuit is employed for resetting. Therefore, the effective pulse signal of the first input signal terminal is delayed for ⅔ of the clock cycle compared with the effective pulse signal of the second input signal terminal.

Figure 2:
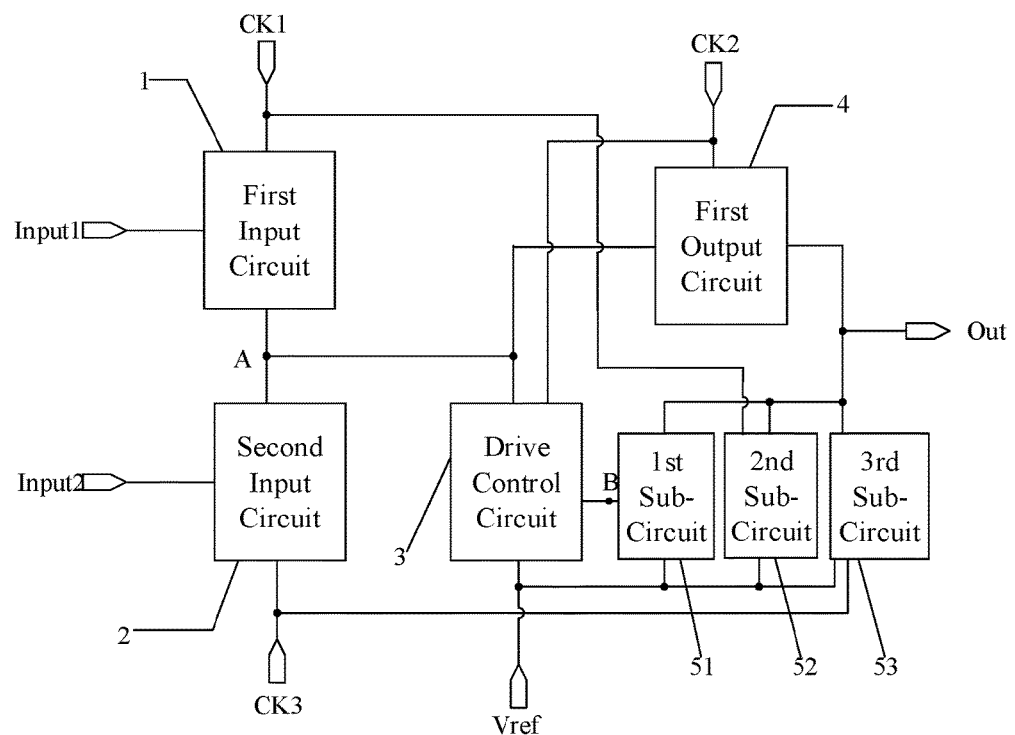
FIG. 2 is a schematic diagram of the structure of a shift register according to some embodiments.

In the shift register according to some embodiments, as illustrated in FIG. 2, the second output circuit 5 comprises: a first sub-circuit 51, a second sub-circuit 52, and a third sub-circuit 53.

The control terminal of the first sub-circuit 51 is coupled to the second node B, the input terminal of the first sub-circuit 51 is coupled to the reference signal terminal Vref, the output terminal of the first sub-circuit 51 is coupled to the scan signal output terminal Out; the first sub-circuit 51 is configured to provide the signals from the reference signal terminal Vref to the scan signal output terminal Out under the control of the second node B.

The control terminal of the second sub-circuit 52 is coupled to the first clock signal terminal CK1, the input terminal of the second sub-circuit 52 is coupled to the reference signal terminal Vref, the output terminal of the second sub-circuit 52 is coupled to the scan signal output terminal Out; the second sub-circuit 52 is configured to provide the signals from the reference terminal Vref to the scan signal output terminal Out under the control of the first clock signal terminal CK1.

The control terminal of the third sub-circuit 53 is coupled to the third clock signal terminal CK3, the input terminal of the third sub-circuit 53 is coupled to the reference signal terminal Vref, the output terminal of the third sub-circuit 53 is coupled to the scan signal output terminal Out; the third sub-circuit 53 is configured to provide the signals from the reference signal terminal Vref to the scan signal output terminal Out under the control of the third clock signal terminal CK3.

Figure 3:
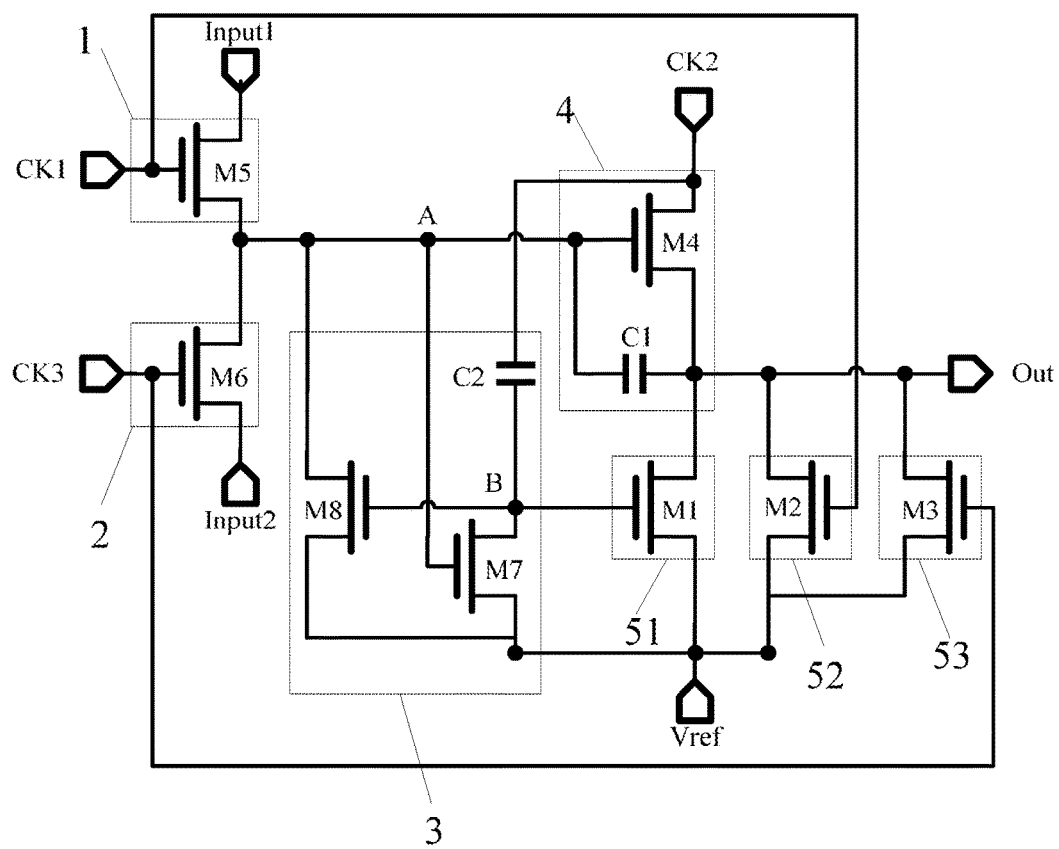
FIG. 3 is a schematic diagram of the structure of a shift register comprising an N-type transistor switch according to some embodiments.
Figure 4:
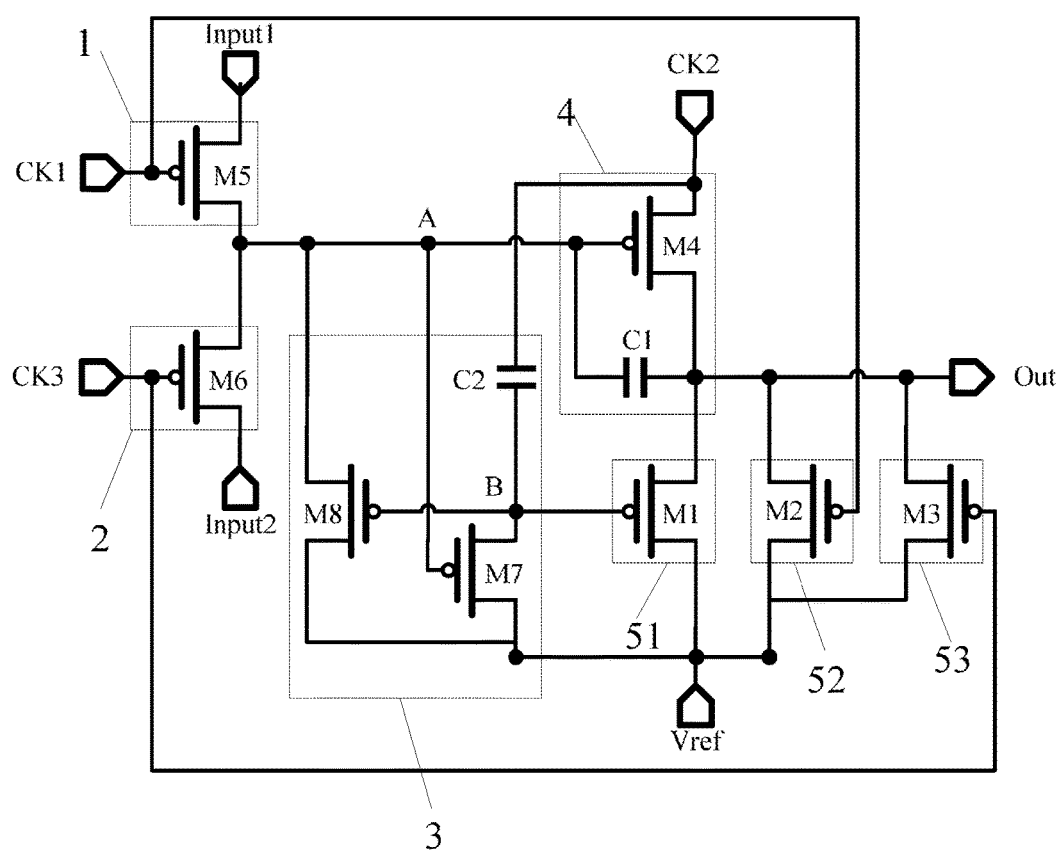
FIG. 4 is a schematic diagram of the structure of a shift register comprising a P-type transistor switch according to some embodiments.

In some embodiments of the shift register, as shown in FIG. 3 and FIG. 4, the first sub-circuit 51 comprises a first transistor switch M1. The gate electrode of the first transistor switch M1 is coupled to the second node B, the source electrode of the first transistor switch M1 is coupled to the reference signal terminal Vref, and the drain electrode of the first transistor switch M1 is coupled to the scan signal output terminal Out. As such, if the second node B turns on the first transistor switch M1, the first transistor switch M1 that is turned on will provide the signals from the reference signal terminal Vref to the scan signal output terminal Out.

In some embodiments, if the effective pulse signals of the first input signal terminal and the second input signal terminal are both high-potential signals, as shown in FIG. 3, the first transistor switch M1 can be an N-type transistor; if the effective pulse signals of the first input signal terminal and the second input signal terminal are both low-potential signals, as shown in FIG. 4, the first transistor switch M1 can be a P-type transistor.

The implementation of the first sub-circuit described above is merely an example used to illustrate a specific structure of the first sub-circuit. Other implementations and structures of the first sub-circuit are possible, and are not limited to the above-described example.

In some embodiments of the shift register, as illustrated in FIG. 3 and FIG. 4, the second sub-circuit 52 comprises a second transistor switch M2. The gate electrode of the second transistor switch M2 is coupled to the first clock signal terminal CK1, the source electrode of the second transistor switch M2 is coupled to the reference signal terminal Vref, and the drain electrode is coupled to the scan signal output terminal Out. As such, if the first clock signal terminal CK1 turns on the second transistor switch M2, the second transistor switch M2 that is turned on will provide the signals of the reference signal terminal Vref to the scan signal output terminal Out.

In some embodiments, if the effective pulse signals of the first input signal terminal and the second input signal terminal are both high-potential signals, as shown in FIG. 3, the second transistor switch M2 can be an N-type transistor; if the effective pulse signals of the first input signal terminal and the second input signal terminal are both low-potential signals, as shown in FIG. 4, the second transistor switch M2 can be a P-type transistor.

The implementation of the second sub-circuit described above is merely an example used to illustrate a specific structure of the second sub-circuit. Other implementations and structures of the second sub-circuit are possible, and are not limited to the above-described example.

In some embodiments of the shift register, as illustrated in FIG. 3 and FIG. 4, the third sub-circuit 53 comprises a third transistor switch M3. The gate electrode of the third transistor switch M3 is coupled to the third clock signal terminal CK3, the source electrode of the third transistor switch M3 is coupled to the reference signal terminal Vref, the drain electrode of the third transistor switch M3 is coupled to the scan signal output terminal Out. As such, if the third clock signal terminal CK3 turns on the third transistor switch M3, the third transistor switch M3 that is turned on provides the signals from the reference signal terminal Vref to the scan signal output terminal Out.

In some embodiments, if the effective pulse signals of the first input signal terminal and second input signal terminal are both high-potential signals, as shown in FIG. 3, the third transistor switch M2 can be an N-type transistor; if the effective pulse signals of the first input signal terminal and the second input signal terminal are both low-potential signals, as shown in FIG. 4, the third transistor switch M3 can be a P-type transistor.

The implementation of the third sub-circuit described above is merely an example used to illustrate a specific structure of the third sub-circuit. Other implementations and structures of the third sub-circuit are possible, and are not limited to the above-described example.

The signals of the reference signal terminal are provided to the scan signal output terminal alternately through the first transistor switch, the second transistor switch, and the third transistor switch according to some embodiments. As such, the duty cycle of each of the three transistor switches within one frame of time is reduced, thereby facilitating a suppression of the threshold voltage floating of the transistor switches, thus further avoiding the instability of the circuit resulting from the floating of the threshold voltage, leading to a long-term reliability of the shift register.

In some embodiments, as shown in FIG. 3 and FIG. 4, the first output circuit comprise a fourth transistor switch M4.

The gate electrode of the fourth transistor switch M4 is coupled to the first node A, the source electrode of the fourth transistor switch M4 is coupled to the second clock signal terminal CK2, and the drain electrode of the fourth transistor switch M4 is coupled to the scan signal output terminal Out. If the first node A turns on the fourth transistor switch M4, the fourth transistor switch M4 that is turned on provides the signals of the second clock signal terminal CK2 to the scan signal output terminal Out; if the first node A is in a floating state, the parasitic capacitance between the gate electrode and the drain electrode of the fourth transistor switch M4 can keep a stable voltage difference between the first node A and the scan signal output terminal Out as a result of bootstrap effects.

In some embodiments, as shown in FIG. 3 and FIG. 4, the first output circuit 4 also comprise a first capacitor C1, arranged between the gate electrode and the drain electrode of the fourth transistor M4. As such, if the first node A is in floating state, the voltage difference between first node A and scan signal output terminal Out is maintained stable through the bootstrap effect of the first capacitor C1. The first capacitor C1 can utilize a parasitic capacitance of the transistors, or can be a dedicated capacitor.

In some embodiments, if the effective pulse signals of the first input signal terminal and the second input signal terminal are both high-potential signals, as shown in FIG. 3, the fourth transistor switch can be an N-type transistor; if the effective pulse signals of the first input signal terminal and the second input signal terminal are both low-potential signals, as shown in FIG. 4, the fourth transistor switch can be a P-type transistor.

The implementation of the first output circuit described above is merely an example used to illustrate a specific structure of the first output circuit. Other implementations and structures of the first output circuit are possible, and are not limited to the above-described example.

In the shift register as described above, after the scan signal output terminal outputs effective scanning signals, because the second input circuit turns on the fourth transistor switch, and the fourth transistor switch is usually the largest transistor in the shift register, its pull-down (or pull-up) is very quick, which can minimize the delay of the scan signals.

As such, the sizes of the first transistor switch, the second transistor switch, and the third transistor switch can be reduced, which is not only beneficial to narrow-boarder designs.

Moreover, because the stability of transistor switch is correlated to its size, the larger the size, the larger the shift of the threshold under stress, and the lower the stability of the transistor switch. As such, reducing the sizes of the first transistor switch, the second transistor switch, and the third transistor switch to certain degrees is beneficial to the stability of the shift register.

Therefore, in some embodiments of the shift register, the sizes of the first transistor switch, the second transistor switch, and the third transistor switch are all smaller than the size of the fourth transistor switch.

In some embodiments of the shift register, as shown in FIG. 3 and FIG. 4, the first input circuit 1 comprises a fifth transistor switch M5.

The gate electrode of the fifth transistor switch M5 is coupled to the first clock signal terminal CK1, the source electrode of the fifth transistor switch M5 is coupled to the first input signal terminal Input1, the drain electrode of the fifth transistor switch M5 is coupled to the first node A. As such, if the first clock signal terminal CK1 turns on the fifth transistor switch M5, the fifth transistor switch M5 that is turned on provides the signals of the first input signal terminal Input1 to the scan signal output terminal Out.

In some embodiments, if the effective pulse signals of the first input signal terminal and the second input signal terminal are both high-potential signals, as shown in FIG. 3, the fifth transistor switch M5 can be an N-type transistor; if the effective pulse signals of the first input signal terminal and the second input signal terminal are both low-potential signals, as shown in FIG. 4, the fifth transistor switch M5 can be a P-type transistor.

The implementation of the first input circuit described above is merely an example used to illustrate a specific structure of the first input circuit. Other implementations and structures of the first input circuit are possible, and are not limited to the above-described example.

In some embodiments of the shift register, as shown in FIG. 3 and FIG. 4, the second input circuit 2 comprises a sixth transistor switch M6.

The gate electrode of the sixth transistor switch M6 is coupled to the third clock signal terminal CK3, the source electrode of the sixth transistor switch M6 is coupled to the second input signal terminal Input2, the drain electrode of the sixth transistor switch M6 is coupled to the first node A.

As such, if the third clock signal terminal CK3 turns on the sixth transistor switch M6, the sixth transistor switch M6 that is turned on provides the signals of the second input signal terminal Input2 to the scan signal output terminal Out.

In some embodiments, if the effective pulse signals of the first input signal terminal and the second input signal terminal are both high-potential signals, as shown in FIG. 3, the sixth transistor switch M6 can be an N-type transistor; if the effective pulse signals of the first input signal terminal and the second input signal terminal are both low-potentials signals, as shown in FIG. 4, the sixth transistor switch M6 can be a P-type transistor.

The implementation of the second input circuit described above is merely an example used to illustrate a specific structure of the second input circuit. Other implementations and structures of the second input circuit are possible, and are not limited to the above-described example.

In some embodiments of the shift register, as shown in FIG. 3 and FIG. 4, the drive control circuit 3 comprises a seventh transistor switch M7 and an eighth transistor switch M8.

The gate electrode of the seventh transistor switch M7 is coupled to the first node A, the source electrode the seventh transistor switch M7 is coupled to the reference signal terminal Vref, the drain electrode the seventh transistor switch M7 is coupled to the second node B.

The gate electrode of the eighth transistor switch M8 is coupled to the second node B, the source electrode of the eighth transistor switch M8 is coupled to the reference terminal Vref, the drain electrode of the eighth transistor switch M8 is coupled to the first node A.

As such, if the first node A turns on the seventh transistor switch M7, the seventh transistor switch M7 that is turned on provides the signals of the reference signal terminal Vref to the scan signal output terminal Out; if the second node B turns on the eighth transistor switch M8, the eighth transistor switch M8 that is turned on provides the signals of the reference signal terminal Vref to the scan signal output terminal Out; if the second node B is in floating state, the parasitic capacitance of the transistor switch in the shift register keeps the voltage difference between the second node B and the second clock signal terminal CK2 stable due to bootstrap effect.

In some embodiments of the shift register, as shown in FIG. 3 and FIG. 4, the drive control circuit 3 also comprises a second capacitor C2, arranged between the second node B and the second clock signal terminal CK2. As such, if the second node B is in a floating state, the voltage difference between the second node B and the second clock signal terminal CK2 will be kept stable as a result of the bootstrap effect of the second capacitor C2. The second capacitor C2 can utilize a parasitic capacitance of the transistors, or can be a dedicated capacitor.

In some embodiments, if the effective pulse signals of the first input signal terminal and the second input signal terminal are both high-potential signals, as shown in FIG. 3, the seventh transistor switch M7 and the eighth transistor switch M8 can be N-type transistors; if the effective pulse signals of the first input signal terminal and the second input signal terminal are both low-potentials signals, as shown in FIG. 4, the seventh transistor switch M7 and the eighth transistor switch M8 can be P-type transistors.

The implementation of the drive control circuit described above is merely an example used to illustrate a specific structure of the drive control circuit. Other implementations and structures of the drive control circuit are possible, and are not limited to the above-described example.

In some embodiments of the shift register, in order to simplify the fabrication process, the transistor switches generally can employ transistors of same types of materials. Therefore, in some embodiments, all the above-described transistor switches can employ N-type transistors or P-type transistors. Each of the N-type transistors can be turned off if the electric potential is low, and can be turned on if the electric potential is high; each of the P-type transistors can be turned off if the electric potential is high, and can be turned on if the electric potential is low.

In some embodiments, the transistor switches can be thin film transistors (TFT). In some embodiments, the transistor switches can be metal oxide semiconductor field effect transistors (MOSFET). In some other embodiments, other types of transistors can be employed. In some embodiments, the functions of the source electrode and the drain electrode of these transistor switches can be interchanged according to the types of the transistors and the different input signals. As such, the reference to the "source" or "drain" are merely relative in some embodiments.

The following is a description of an example working process of the above-described shift register as shown in FIG. 3 and FIG. 4, utilizing a forward scan as examples. In the following descriptions, "1" represents a high electric potential signal, and "0" represents a low electric potential signal.

Embodiment 1

Figure 5:
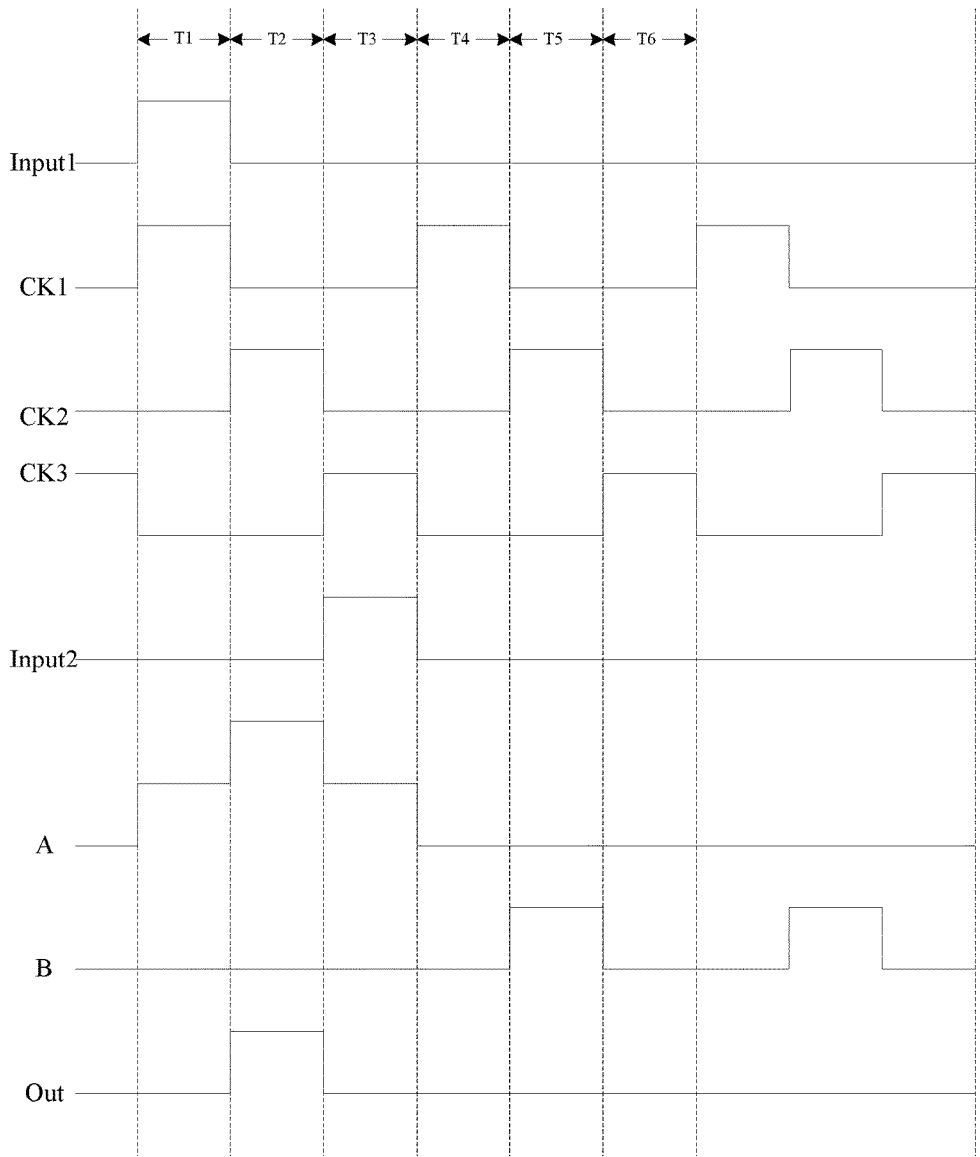
FIG. 5 is a circuit timing sequence diagram of the forward scanning shift register of FIG. 3.

A description of an example working process of the shift register according to some embodiments is provided below with reference to FIG. 3, using the input and output timing sequence diagram shown in FIG. 5 as an example. Specifically, six stages T1~T6 are selected for illustration in the input and output timing sequence diagram as shown in FIG. 5.

At T1 stage, Input1=1, Input2=0, CK1=1, CK2=0, CK3=0.

Because CK1=1, the second transistor switch M2 and the fifth transistor switch M5 are on, the fifth transistor switch M5 that is turned on provides the high electric potential signals of the first input signal terminal Input1 to the first node A, therefore the first node A is at a high electric potential.

The fourth transistor switch M4 and the seventh transistor switch M7 are on, the seventh transistor switch M7 provides the low electric potential signals of the reference signal terminal Vref to the second node B, the second node B is at low electric potential; the fourth transistor switch M4 that is turned on provides low electric potential signals of the second clock signal terminal CK2 to the scan signal output terminal Out, meanwhile, the second transistor switch M2 that is turned on provides the low electric potential signals of the reference signal terminal Vref to the scan signal output terminal Out, therefore the scan signal output terminal is at a low electric potential, and the first capacitor C1 starts charging.

At this stage, the first transistor switch M1, the third transistor switch M3, the sixth transistor switch M6, and the eighth transistor switch M8 are off.

At T2 stage, Input1=0, Input 2=0, CK1=0, CK2=1, CK3=0.

The first node A is in a floating state, and still at a high electric potential; the fourth transistor switch M4 and the seventh transistor switch M7 are on, the seventh transistor switch M7 provides the low electric potential signals of the reference signal terminal Vref to the second node B, the second node B is at a low electric potential; the fourth transistor switch M4 that is turned on provides the high electric potential signals of the second clock signal terminal CK2 to the scan signal output terminal Out, the electric potential of the scan signal output terminal Out is pulled up to high electric potential, as a result of the bootstrap effect of the first capacitor C1; the electric potential of the first node A is further pulled up from a level of the T1 stage.

In some embodiments, the clock signals are configured to control the plurality of input terminals to thereby provide an increased gate electrode potential to the fourth transistor switch during a second clock pulse width relative to a high gate electrode potential during a first, adjacent, clock pulse, thereby facilitating a fast pull down after a pull up by the fourth transistor switch.

For example, an electric potential at the gate electrode of the fourth transistor switch M4 is increased during a second clock pulse width (the T2 stage), relative to the already-high gate electrode potential during a first clock pulse width (the T1 stage), thereby ensuring the high electric potential signals of the second clock signal terminal CK2 to completely output to the scan signal output terminal Out without the influence from the threshold voltage of the fourth transistor switch M4.

As such, the fourth transistor switch M4 can achieve a fast pull down after a pull up. In some embodiments, the larger size of the fourth transistor switch M4 also contributes to the fast pull down after a pull up, while other pull-down transistor switches can have smaller sizes because they mainly just maintain the potential level. The reliability of the circuit can thus be improved.

At this stage, the first transistor switch M1, the second transistor switch M2, the third transistor switch M3, the fifth transistor switch M5, the sixth transistor switch M6 and the eighth transistor switch M8 are off.

At T3 stage, Input1=0, Input2=1, CK1=0, CK2=0, CK3=1.

Because CK3=1, the third transistor switch M3 and the sixth transistor switch M6 are on, the sixth transistor switch M6 that is turned on provides the high electric potential signals of the second input signal terminal Input2 to the first node A, therefore the first node A is at a high electric potential; the fourth transistor switch M4 and the seventh transistor switch M7 are on, the seventh transistor switch M7 that is turned on provides the low electric potential signals of the reference signal terminal Vref to the second node B, the second node B is at low electric potential; the fourth transistor switch M4 that is turned on provides the low electric potential signals of the second clock signal terminal CK2 to the scan signal output terminal Out.

Meanwhile, the third transistor switch M3 that is turned on provides the low electric potential signals of the reference signal terminal Vref to the scan signal output terminal Out, therefore the electric potential of scan signal output terminal Out is quickly pulled down to a low electric potential, and because the fourth transistor switch M4 is the largest transistor in the shift register, its pull-down is very fast, ensuring the delay of the pull-down of the scan signal output terminal Out to be the smallest.

The sizes of the first transistor switch M1, the second transistor switch M2, and the third transistor switch M3 can be reduced to some extent, thereby improving the stability of the circuit.

At this stage, the first transistor switch M1, the second transistor switch M2, the fifth transistor switch M5, and the eighth transistor switch M8 are off.

At T4 stage, Input1=0, Input 2=0, CK1=1, CK2=0, CK3=0.

Because CK1=1, the second transistor switch M2 and the fifth transistor switch M5 are on, the fifth transistor switch M5 that is turned on provides the low electric potential signals of the first input signal terminal Input1 to the first node A, the electric potential of the first node A is pulled down to a low electric potential, the second transistor switch M2 that is turned on provides the low electric potential signals of the reference signal terminal Vref to the scan signal output terminal Out, therefore the scan signal output terminal Out is at a low electric potential.

Because the second node B is in a floating state, CK2=0, the second node B remains at a low electric potential of stage T3. At this stage, the first transistor switch M1, the third transistor switch M3, the fourth transistor switch M4, the sixth transistor switch M6, the seventh transistor switch M7, and the eighth transistor switch M8 are off.

At T5 stage, Input1=0, Input 2=0, CK1=0, CK2=1, CK3=0.

The second node B is in a floating state. As a result of the bootstrap effect of the second capacitor C2, if CK2 changes from 0 of the last stage to 1 of this stage, the second node B is changed to a high electric potential together; the first transistor switch M1 and the eighth transistor switch M8 are on, the eighth transistor switch M8 that is turned on provides the low electric potential signals of the reference signal terminal Vref to the first node A, the electric potential of first node A is changed to a low electric potential, the first transistor switch M1 that is turned on provides the low electric potential signals of the reference signal terminal Vref to the scan signal output terminal Out, the electric potential of the signal output terminal is still at a low electric potential.

At this stage, the second transistor switch M2, the third transistor switch M3, the fourth transistor switch M4, the fifth transistor switch M5, the sixth transistor switch M6, and the seventh transistor switch M7 are off.

At T6 stage, Input1=0, Input 2=0, CK1=0, CK2=0, CK3=1.

Because CK3=1, the third transistor switch M3 and the sixth transistor switch M6 are on, the sixth transistor switch M6 that is turned on provides the low electric potential signals of the second input signal terminal Input2 to the first node A, the electric potential of the first node A is still at a low electric potential; because CK2=0, the electric potential of the second node B that is in floating state is changed to low electric potential, the third transistor switch M3 that is turned on provides the low electric potential signals of the reference signal terminal Vref to the scan signal output terminal Out, the electric potential of the scan signal output terminal Out is still at a low electric potential.

At this stage, the first transistor switch M1, the second transistor switch M2, the fourth transistor switch M4, the fifth transistor switch M5, the seventh transistor switch M7 and the eighth transistor switch M8 are all off.

Subsequently, the second transistor switch, the first transistor switch, the third transistor switch provide the low electric potential signals of the reference signal terminal to the scan signal output terminal alternately, ensuring that the scan signal output terminal has no uncertain states, and the output waveform is more stable.

Furthermore, because the second transistor switch, the first transistor switch, and the third transistor switch pull down the scan signal output terminal alternately, the duty cycles of these three transistor switches can be reduced, facilitating suppression of the threshold voltage shift of transistor switches, thereby avoiding the instability of the circuit resulting from the shift of threshold voltage of the transistor switches, leading to a long-term reliability of the shift register.

Embodiment 2

Figure 6:
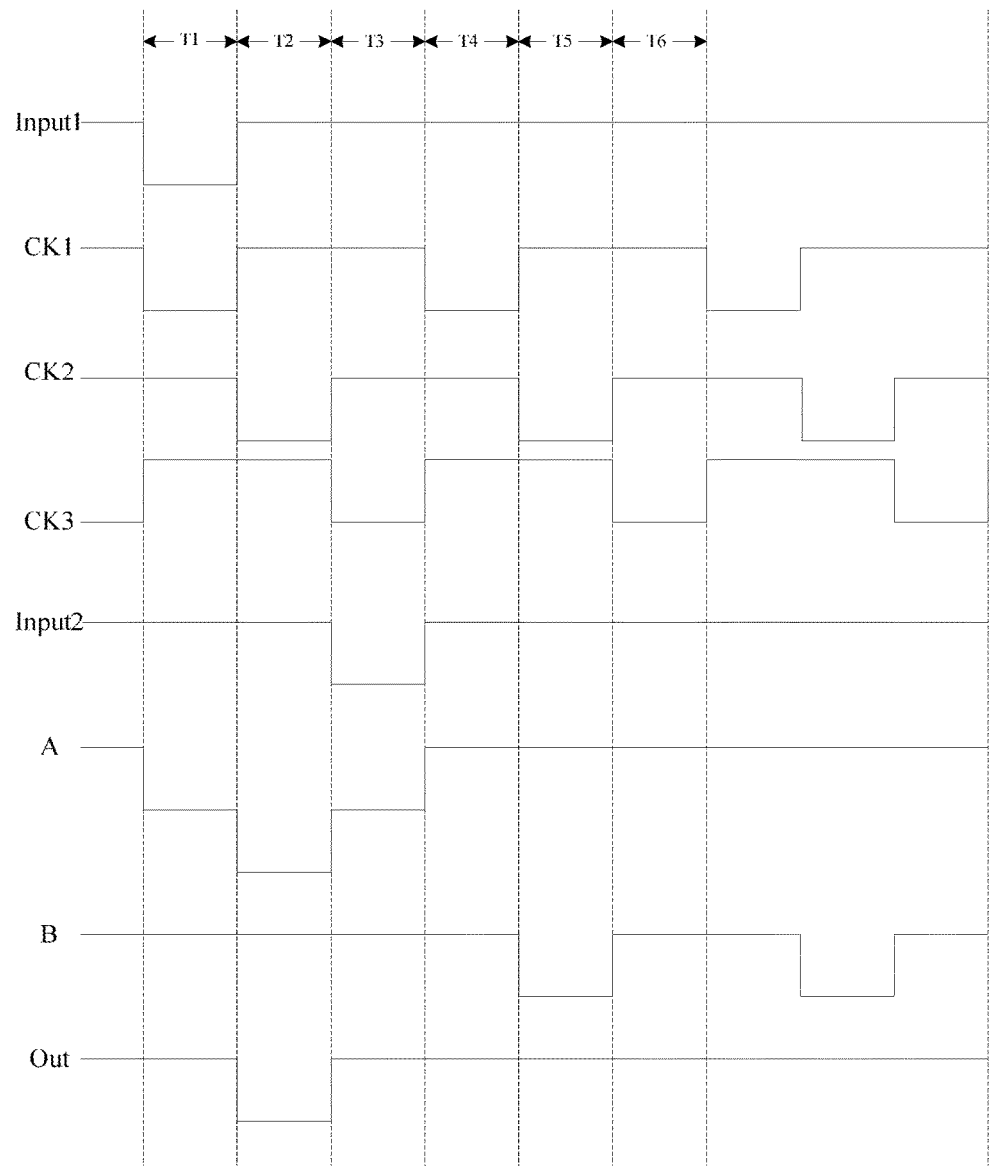
FIG. 6 is a circuit timing sequence diagram of the forward scanning shift register of FIG. 4.

A description of an example working process of the shift register in FIG. 4 according to some embodiments is provided below, using the input and output timing sequence diagram as shown in FIG. 6 as an example. Specifically, six stages T1~T6 in the input and output timing sequence diagram as shown in FIG. 6 are selected for the purpose of illustration.

At T1 stage, Input1=0, Input2=1, CK1=0, CK2=1, CK3=1.

Because CK1=0, the second transistor switch M2 and the fifth transistor switch M5 are on, the fifth transistor switch M5 that is turned on provides the low electric potential signals of the first input signal terminal Input1 to the first node A, therefore the electric potential of the first node A is a low electric potential; the fourth transistor switch M4 and the seventh transistor switch M7 are on, the seventh transistor switch M7 provides the high electric potential signals of the reference signal terminal Vref to the second node B, the electric potential of the second node B is a high electric potential; the fourth transistor switch M4 that is turned on provides high electric potential signals of the second clock signal terminal CK2 to the scan signal output terminal Out.

Meanwhile, the second transistor switch M2 that is turned on provides the high electric potential signals of the reference signal terminal Vref to the scan signal output terminal Out, therefore the electric potential of the scan signal output terminal is high electric potential, the first capacitor starts charging.

At this stage, the first transistor switch M1, the third transistor switch M3, the sixth transistor switch M6, and the eighth transistor switch M8 are off.

At T2 stage, Input1=1, Input 2=1, CK1=1, CK2=0, CK3=1.

The first node A is in a floating state, and is still at a low electric potential; the fourth transistor switch M4 and the seventh transistor switch M7 are on, the seventh transistor switch M7 provides the high electric potential signals of the reference signal terminal Vref to the second node B, the electric potential of the second node B is at a high electric potential, the fourth transistor switch M4 that is turned on provides the low electric potential signals of the second clock signal terminal CK2 to the scan signal output terminal Out, the electric potential of the scan signal output terminal Out is pulled down to a low electric potential; due to the bootstrap effect of the first capacitor C1, the electric potential of the first node A is further pulled down from a level of the T1 stage, thus ensuring the low electric potential signals of the second clock signal terminal CK2 to completely output to the scan signal output terminal Out and not to be influenced by the threshold voltage of the fourth transistor switch M4.

At this stage, the first transistor switch M1, the second transistor switch M2, the third transistor switch M3, the fifth transistor switch M5, the sixth transistor switch M6, and the eighth transistor switch M8 are off.

At T3 stage, Input1=1, Input2=0, CK1=1, CK2=1, CK3=0.

Because CK3=0, the third transistor switch M3 and the sixth transistor switch M6 are on, the sixth transistor switch M6 that is turned on provides the low electric potential signals of the second input signal terminal Input2 to the first node A, therefore the electric potential of the first node A is a low electric potential, the fourth transistor switch M4 and the seventh transistor switch M7 are on, the seventh transistor switch M7 that is turned on provides the high electric potential signals of the reference signal terminal Vref to the second node B, the electric potential of the second node B is a high electric potential, the fourth transistor switch M4 that is turned on provides the high electric potential signals of the second clock signal terminal CK2 to the scan signal output terminal Out.

Meanwhile, the third transistor switch M3 that is turned on provides the high electric potential signals of the reference signal terminal Vref to the scan signal output terminal Out, therefore the electric potential of the scan signal output terminal Out is quickly pulled up to high electric potential, and because the fourth transistor switch M4 is the largest transistor in the shift register, its pull-down is very fast, ensuring the delay of the pull-down of scan signal output terminal Out to be the smallest.

In addition, reducing the sizes of the first transistor switch M1, the second transistor switch M2, and the third transistor switch M3 to some extent can improve the stability of the circuit.

At this stage, the first transistor switch M1, the second transistor switch M2, the fifth transistor switch M5, and the eighth transistor switch M8 are off.

At T4 stage, Input1=1, Input 2=1, CK1=0, CK2=1, CK3=1.

Because CK1=0, the second transistor switch M2 and the fifth transistor switch M5 are on, the fifth transistor switch M5 that is turned on provides the high electric potential signals of the first input signal terminal Input1 to the first node A, the electric potential of the first node A is pulled up to a high electric potential, the second transistor switch M2 that is turned on provides the high electric potential signals of the reference signal terminal Vref to the scan signal output terminal Out, therefore the electric potential of the scan signal output terminal Out is a high electric potential; because the second node B is in a floating state, CK2=1, the second node B remains at a high electric potential of stage T3.

At this stage, the first transistor switch M1, the third transistor switch M3, the fourth transistor switch M4, the sixth transistor switch M6, the seventh transistor switch M7, and the eighth transistor switch M8 are off.

At T5 stage, Input1=1, Input 2=1, CK1=1, CK2=0, CK3=1.

The second node B is in a floating state. As a result of the bootstrap effect of the second capacitor C2, if CK2 changes from 1 of the last stage to 0 of this stage, the second node B is also changed to a low electric potential; the first transistor switch M1 and the eighth transistor switch M8 are on, the eighth transistor switch M8 that is turned on provides the high electric potential signals of the reference signal terminal Vref to the first node A, the electric potential of the first node A is changed to a high electric potential, the first transistor switch M2 that is turned on provides the high electric potential signals of the reference signal terminal Vref to the scan signal output terminal Out, the electric potential of the scan signal output terminal is still a high electric potential.

At this stage, the second transistor switch M2, the third transistor switch M3, the fourth transistor switch M4, the fifth transistor switch M5, the sixth transistor switch M6, and the seventh transistor switch M7 are off.

At T6 stage, Input1=1, Input 2=1, CK1=1, CK2=1, CK3=0.

Because CK3=0, the third transistor switch M3 and the sixth transistor switch M6 are on, the sixth transistor switch M6 that is turned on provides the high electric potential signals of the second input signal terminal Input2 to the first node A, the electric potential of the first node A is still a high electric potential; because CK2=1, the electric potential of node B that is in floating state is changed to a high electric potential, the third transistor switch M3 that is turned on provides the high electric potential signals of the reference signal terminal Vref to the scan signal output terminal Out, the electric potential of the scan signal output terminal Out is still a high electric potential.

At this stage, the first transistor switch M1, the second transistor switch M2, the fourth transistor switch M4, the fifth transistor switch M5, the seventh transistor switch M7, and the eighth transistor switch M8 are all off.

Next, the second transistor switch, the first transistor switch, and the third transistor switch provide the high electric potential signals of the reference signal terminal to the scan signal output terminal alternately, ensuring that the scan signal output terminal has no uncertain states, and the output waveform is more stable.

Furthermore, because the second transistor switch, the first transistor switch, and the third transistor switch pull up the scan signal output terminal alternately, the duty cycles of these three transistor switches can be reduced, thereby facilitating the suppression of the threshold voltage shift of the transistor switches, thereby avoiding the instability of the circuit resulting from the shift of threshold voltage of the transistor switches, leading to long-term reliability of the shift register.

Figure 7:
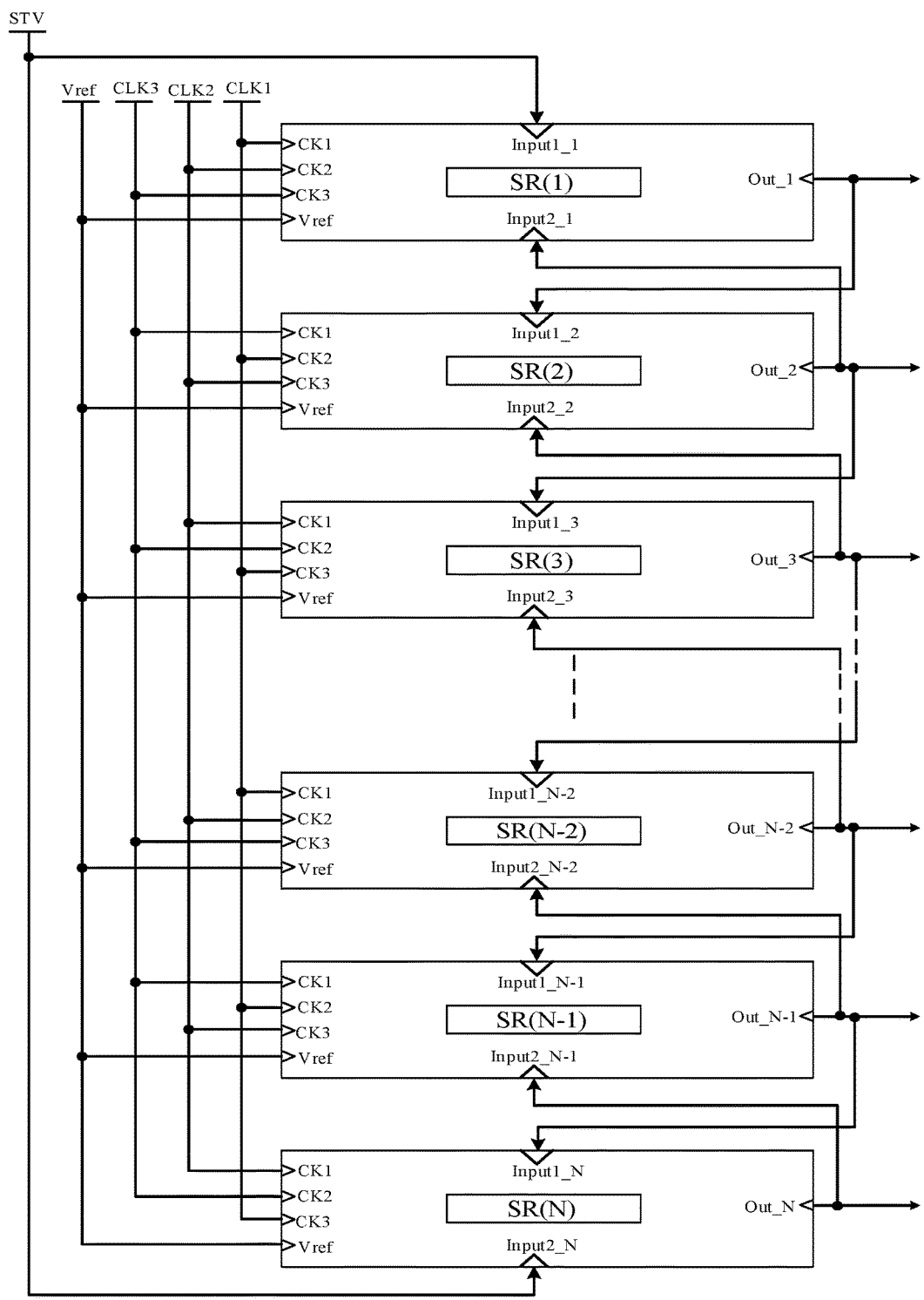
FIG. 7 is a schematic diagram of the structure of the gate electrode driving circuit according to some embodiments.

In some embodiments, a gate drive circuit is provided, as shown in FIG. 7. The gate drive circuit comprises a plurality of cascaded shift registers: SR(1), SR(2) . . . SR(n) . . . SR(N-1), SR(N). For example, a total of N shift registers can be included, wherein 1≤n≤N.

Except the last stage shift register SR(N), the scan signal output terminal Out_n of each of the remaining stages of the shift registers SR(n) is coupled to the first input signal terminal Input1_n+1 of the coupled next stage of shift register SR(n+1); except the first stage shift register SR(1), the scan signal output terminal Out_n of each of the remaining stages of shift registers SR(n) is coupled to the second input signal terminal Input2_n−1 of the last stage shift register SR(n−1); the first input signal terminal Input1_1 of the first stage shift register SR(1) is coupled to the second input signal terminal Input2_N of the last stage shift register SR(N) and a frame starting signal terminal STV.

In some embodiments, each of the shift registers in the gate drive circuit can be the same in function and structure as the shift registers as described above.

In some embodiments, in the gate drive circuit as shown in FIG. 7, the first clock signal terminal CK1 of the 3m+1 stage shift register SR(m), the second clock signal terminal CK2 of the 3m+2 stage shift register SR(m), the third clock signal terminal CK3 of the 3m+3 stage shift register SR(m) are all coupled to the first clock terminal CLK1 to receive a first clock signal; the second clock signal terminal CK2 of the 3m+1 stage shift register SR(m), the third clock signal terminal CK3 of the 3m+2 stage shift register SR(m), the first clock signal terminal CK1 of the 3m+3 stage shift register SR(m) are all coupled to the second clock terminal CLK2 to receive a second clock signal; the third clock signal terminal CK3 of the 3m+1 stage shift register SR(m), the first clock signal terminal CK1 of the 3m+2 stage shift register SR(m), the second clock signal terminal CK2 of the 3m+3 stage shift register SR(m) are all coupled to the third clock terminal CLK3 to receive a third clock signal; wherein, m is a positive integer between 0 and (N/3−1), N is the total number of shift registers in the gate drive circuit.

The widths of the clock cycles of the first clock signal, the second clock signal, and the third clock signal can be the same and have all their effective duty cycles of ⅓; the first clock cycle, the second clock cycle, and the third clock cycle successively delay ⅓ width of the clock cycle during a forward scan; the third clock signal, the second clock signal, and the first clock signal successively delay ⅓ width of the clock cycle during a backward scan.

In some embodiments, the reference signal terminal of each stage of shift register is each coupled to the same power source. Other configurations are also possible.

Figure 8A:
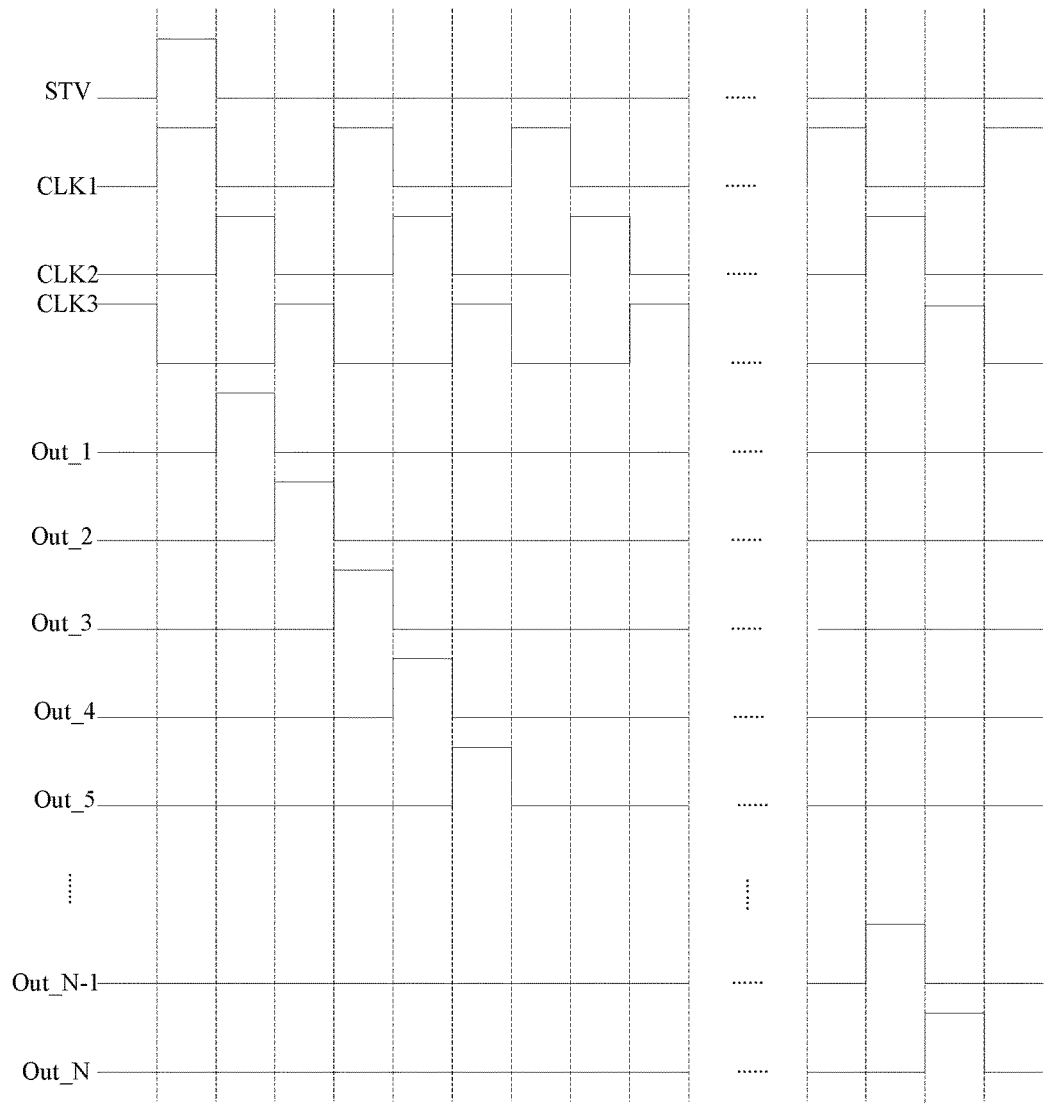
FIG. 8A is a circuit timing sequence diagram of the forward scanning gate electrode driving circuit according to some embodiments.

During a forward scan, the input and output timing sequence diagram according to some embodiments is as shown in FIG. 8A, where the first clock terminal CLK1, the second clock terminal CLK2, and the third clock terminal CLK3 output effective pulse signals alternately. After inputting effective pulse signals from the frame starting signal terminal STV to the first signal input terminal Input1_1 of the first stage shift register, the scan signal output terminal Out_n (n=1, 2, 3, . . . , N) of shift registers of 1~N stages successively outputs scan signals.

Figure 8B:
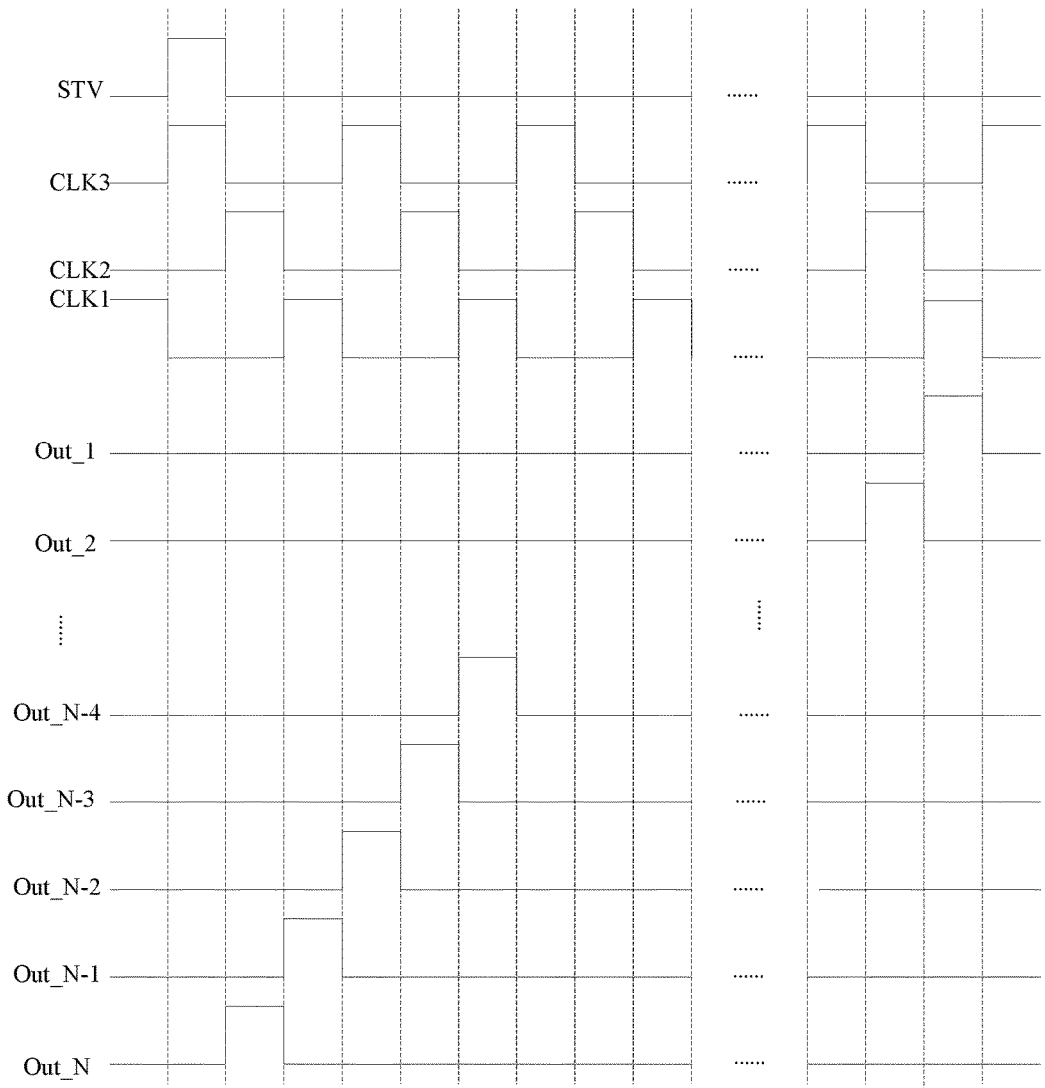
FIG. 8B is a circuit timing sequence diagram of the backward scanning gate electrode driving circuit according to some embodiments.

During a backward scan, the input and output timing sequence diagram according to some embodiments is shown in FIG. 8B, where the third clock terminal CLK3, the second clock terminal CLK2, and the first clock terminal CLK1 output effective pulse signals alternately. After inputting effective pulse signals from the frame starting signal terminal STV to the second signal input terminal Input2_N of the N-th stage shift register, the scan signal output terminal Out_n (n=N. N−1, . . . 3, 2, 1) of shift registers of N~1 stages successively outputs scan signals.

In some embodiments, a driving method is provided for the above-described shift registers, including an input stage, an output stage, a reset stage, and a hold stage.

In the input stage, the first input circuit controls the electric potential of the first node under the control of the first clock signal terminal and the first input signal terminal; the drive control circuit provides the signals of the reference signal terminal to the second node under the control of the first node, the first output circuit provide the signals of the second clock signal terminal to the scan signal output terminal under the control of the first node.

In the output stage, the drive control circuit provides the signals of reference signal terminal to the second node under the control of the first node; the first node is in a floating state, the first output circuit keeps the voltage difference between the first node and the scan signal output terminal, and provides the signals of the second clock signal terminal to the scan signal output terminal under the control of the first node;

In the reset stage, the second input circuit controls the electric potential of the first node under the control the third clock signal terminal and the second input signal terminal; the drive control circuit provides the signals of the reference signal terminal to the second node under the control of the first node; the first output circuit provides the signals of the second clock signal terminal to the scan signal output terminal under the control of the first node.

In the hold stage, the second output circuit provides the signals of the reference signal terminal to the scan signal output terminal under the control of the first clock signal terminal; alternatively, the second node is in floating state, the drive control circuit keeps the voltage difference between the second clock signal terminal and the second node stable; the second output circuit provides the signals of the reference signal terminal to the scan signal output terminal under the control of the second node; alternatively, the second output circuit provides the signals of the reference signal terminal to the scan signal output terminal under the control of the third clock signal terminal.

In some embodiments, a driving method is provided for the above-described shift registers, including an input stage, an output stage, an reset stage, and a hold stage.

In the input stage, the first input circuit provides the signals of the first input signal terminal to the first node under the control of the first clock signal terminal; the drive control circuit provides the signals of the reference signal terminal to the second node under the control of the first node, the first output circuit provide the signals of the second clock signal terminal to the scan signal output terminal under the control of the first node.

In the output stage, the drive control circuit provides the signals of reference signal terminal to the second node under the control of the first node; the first node is in a floating state, the first output circuit keeps the voltage difference between the first node and the scan signal output terminal stable, and provides the signals of the second clock signal terminal to the scan signal output terminal under the control of the first node.

In the reset stage, the second input circuit provides the signals of the second input signal terminal to the first node under the control the third clock signal terminal; the drive control circuit provides the signals of the reference signal terminal to the second node under the control of the first node; the first output circuit provides the signals of the second clock signal terminal to the scan signal output terminal under the control of the first node.

In the hold stage, the second output circuit provides the signals of the reference signal terminal to the scan signal output terminal under the control of the first clock signal terminal; alternatively, the second node is in a floating state, the drive control circuit keeps the voltage difference between the second clock signal terminal and the second node stable; the second output circuit provides the signals of the reference signal terminal to the scan signal output terminal under the control of the second node; alternatively, the second output circuit provides the signals of the reference signal terminal to the scan signal output terminal under the control of the third clock signal terminal.

In some embodiments, in the above-described driving method, the input stage corresponds to the T1 stage in embodiment 1 and embodiment 2, the output stage corresponds to the T2 stage in embodiment 1 and embodiment 2, the reset stage corresponds to the T3 stage in embodiment 1 and embodiment 2, and the hold stage corresponds to the T4 stage, T5 stage, and T6 stage in embodiment 1 and embodiment 2.

In some embodiments, a driving method of above-described shift registers is provided, including an input stage, an output stage, a reset stage. and a hold stage.

In the input stage, the second input circuit provides the signals of the second input signal terminal to the first node under the control of the third clock signal terminal; the drive control circuit provides the signals of the reference signal terminal to the second node under the control of the first node, the first output circuit provide the signals of the second clock signal terminal to the scan signal output terminal under the control of the first node.

In the output stage, the drive control circuit provides the signals of the reference signal terminal to the second node under the control of the first node; the first node is in a floating state, the first output circuit keeps the voltage difference between the first node and the scan signal output terminal stable, and provides the signals of the second clock signal terminal to the scan signal output terminal under the control of the first node.

In the reset stage, the first input circuit provides the signals of the first input signal terminal to the first node under the control the first clock signal terminal; the drive control circuit provides the signals of the reference signal terminal to the second node under the control of the first node; the first output circuit provides the signals of the second clock signal terminal to the scan signal output terminal under the control of the first node.

In the hold stage, the second output circuit provides the signals of the reference signal terminal to the scan signal output terminal under the control of the third clock signal terminal; alternatively, the second node is in a floating state, the drive control circuit keeps the voltage difference between the second clock signal terminal and the second node stable; the second output circuit provides the signals of the reference signal terminal to the scan signal output terminal under the control of the second node; alternatively, the second output circuit provides the signals of the reference signal terminal to the scan signal output terminal under the control of the first clock signal terminal.

The shift register according to some embodiments comprises a first input circuit, a second input circuit, a drive control circuit, a first output circuit, and a second output circuit; wherein, the first input circuit is configured to control the electric potential of a first node under the control of a first clock signal terminal and a first input signal terminal; the second input circuit is configured to control the electric potential of the first node under the control of a third clock signal terminal and a second input signal terminal; the drive control circuit is configured to control the electric potential of the first node and a second node; the first output circuit is configured to control the electric potential of a scan signal output terminal under the control of the first node; the second output circuit is configured to control the electric potential of the scan signal output terminal under the control of the second node, the first clock signal terminal or the third clock signal terminal.

The shift register according to some embodiments has a symmetrical design with respect to the first input circuit and the second input circuit. As such, the shift register can have interchanging functions through timing sequence match of the signals of the input signal terminal and the clock signal terminal. Therefore, the shift register can achieve two-way scanning. As compared with existing technologies, the circuits and methods disclosed herein make it unnecessary to configure a separate control signal to control the scanning direction. As such, narrow-boarder designs can be achieved.

In some embodiments, a display apparatus is provided employing a gate drive circuit including the shift registers described above. For example, the display apparatus can be an LCD apparatus including a plurality of pixels, and a plurality of gate drive circuits configured to control the plurality of pixels. Each gate drive circuit includes a plurality of shift registers realizing cascaded shift registering under control of clock signals. According to some embodiments disclosed herein, the areas of the integrated circuits and the signal lines, thereby facilitating a reduction of the size of the bezel of the LCD display apparatus.

The forward and backward scan direction control can be realized using clock matching. The transistors can have an effective operational duty cycle less than ⅓, thereby facilitating the suppression of the transistor threshold voltage drifting, improving the long-term stability of the circuits. This can be achieved, for example, with a reduced number of transistors, such as 3 pull-down transistors that pull down alternately.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:
1. A shift register, comprising:
a plurality of clock signal terminals;
a first input circuit configured to have input and reset functions;
a second input circuit configured to have input and reset functions and symmetric to the first input circuit to realize a function interchangeable with the first input circuit; and
a plurality of input terminals,
wherein the plurality input terminals are configured to provide input signals under control by one or more clock signals from one or more of the plurality of clock signal terminals to realize both a forward scan and a backward scan of the shift register by interchanging the input and reset functions of the first input circuit and the second input circuit.

2. The shift register of claim 1, further comprising:
a plurality of output terminals; and
a plurality of transistor switches configured to alternately pull down or pull up one or more of the plurality of output terminals under control by one or more clock signals from one or more of the plurality of clock signal terminals.

3. The shift register of claim 2, wherein:
the plurality of transistor switches comprises: a first transistor switch, a second transistor switch, and a third transistor switch;
wherein the first, second, and third transistor switches are configured to alternately pull down one output terminal under control by three clock signals from three clock signal terminals.

4. The shift register of claim 2, further comprising:
a fourth transistor switch;
wherein:
at least one of the plurality of transistor switches has a size smaller than a size of the fourth transistor switch; and
the one or more clock signals are configured to control the plurality of input terminals to thereby provide an increased gate electrode potential to the fourth transistor switch during a second clock pulse width relative to a high gate electrode potential during a first, adjacent, clock pulse, thereby facilitating a fast pull down after a pull up by the fourth transistor switch.

5. The shift register of claim 1, further comprising a reference signal terminal and a scan signal output terminal; wherein:
the plurality of clock signal terminals comprise a first clock signal terminal, a second clock signal terminal, and a third clock signal terminal;
the plurality of input terminals comprise a first input signal terminal and a second input signal terminal;
the shift register further comprises a drive control circuit, a first output circuit, and a second output circuit;
a first terminal of the first input circuit is coupled to the first input signal terminal, a second terminal of the first input circuit is coupled to the first clock signal terminal, a third terminal of the first input circuit is coupled to a first node, and the first input circuit is configured to provide signals of the first input signal terminal to the first node under control of a first clock signal from the first clock signal terminal;
a first terminal of the second input circuit is coupled to the second input signal terminal, a second terminal of the second input circuit is coupled to the third clock signal terminal, a third terminal of the second input circuit is coupled to the first node, and the second input circuit is configured to provide signals of the second input signal terminal to the first node under control of a third clock signal from the third clock signal terminal;
a first terminal of the drive control circuit is coupled to the first node, a second terminal of the drive control circuit is coupled to a second node, a third terminal of the drive control circuit is coupled to the reference signal terminal, a fourth terminal of the drive control circuit is coupled to the second clock signal terminal, and the drive control circuit is configured to provide signals of the reference signal terminal to the second node under control of the first node, to provide signals of the reference signal terminal to the first node under control of the second node, and to keep a stable voltage difference between the second clock signal terminal and the second node if the second node is in a floating state;
a first terminal of the first output circuit is coupled to the first node, the second terminal of the first output circuit is coupled to the second clock signal terminal, a third terminal of the first output circuit is coupled to the scan signal output terminal, and the first output circuit is configured to keep a stable voltage difference between the first node and the scan signal output terminal when the first node is in floating state, and to provide signals of the second clock signal terminal to the scan signal output terminal under control of the first node; and
a first terminal of the second output circuit is coupled to the second node, a second terminal of the second output circuit is coupled to the first clock signal terminal, a third terminal of the second output circuit is coupled to the third clock signal terminal, a fourth terminal of the second output circuit is coupled to the reference signal terminal, a fifth terminal of the second output circuit is coupled to the scan signal output terminal, and the second output circuit is configured to provide signals of the reference signal terminal to the scan signal output terminal under control of the second node, the first clock signal terminal, or the third clock signal terminal.

6. The shift register of claim 5, wherein the second output circuit comprises a first sub-circuit, a second sub-circuit, and a third sub-circuit, wherein:
a control terminal of the first sub-circuit is coupled to the second node, an input terminal of the first sub-circuit is coupled to the reference signal terminal, an output terminal of the first sub-circuit is coupled to the scan signal output terminal, and the first sub-circuit is configured to provide signals of the reference signal terminal to the scan signal output terminal under control of the second node;
a control terminal of the second sub-circuit is connected to the first clock signal terminal, an input terminal of the second sub-circuit is coupled to the reference signal terminal, an output terminal of the second sub-circuit is coupled to the scan signal output terminal, and the second sub-circuit is configured to provide signals of the reference signal terminal to the scan signal output terminal under control of the first clock signal terminal; and
a control terminal of the third sub-circuit is coupled to the third clock signal terminal, an input terminal of the third sub-circuit is connected to the reference signal terminal, an output terminal of the third sub-circuit is coupled to the scan signal output terminal, and the third sub-circuit is configured to provide signals of the reference signal terminal to the scan signal output terminal under control of the third clock signal terminal.

7. The shift register of claim 6, wherein:
the first sub-circuit comprises a first transistor switch, wherein: a gate electrode of the first transistor switch is coupled to the second node, a source electrode of the first transistor switch is coupled to the reference signal terminal, and a drain electrode of the first transistor switch is coupled to the scan signal output terminal.

8. The shift register of claim 6, wherein:
the second sub-circuit comprises a second transistor switch, wherein a gate electrode of the second transistor switch is coupled to the first clock signal terminal, a source electrode of the second transistor switch is coupled to the reference signal terminal, a drain electrode of the second transistor switch is coupled to the scan signal output terminal.

9. The shift register of claim 6, wherein:
the third sub-circuit comprises a third transistor switch, wherein a gate electrode of the third transistor switch is coupled to the third clock signal terminal, a source electrode of the third transistor switch is coupled to the reference signal terminal, a drain electrode of the third transistor switch is coupled to the scan signal output terminal.

10. The shift register of claim 5, wherein:
the first output circuit comprises a fourth transistor switch, wherein a gate electrode of the fourth transistor switch is coupled to the first node, a source electrode of the fourth transistor switch is coupled to the second clock signal terminal, and a drain electrode of the fourth transistor switch is coupled to the scan signal output terminal.

11. The shift register of claim 10, wherein the first output circuit further comprises a first capacitor between the gate electrode and the drain electrode of the fourth transistor switch.

12. The shift register of claim 11, wherein a size of the first transistor switch, a size of the second transistor switch, and a size of the third transistor switch are all smaller than a size of the fourth transistor switch.

13. The shift register of claim 11, wherein:
the first input circuit further comprises a fifth transistor switch;
a gate electrode of the fifth transistor switch is coupled to the first clock signal terminal;
a source electrode of the fifth transistor switch is coupled to the first input signal terminal; and
a drain electrode of the fifth transistor switch is coupled to the first node.

14. The shift register of claim 11, wherein:
the second input circuit further comprises a sixth transistor switch;
a gate electrode of the sixth transistor switch is coupled to the third clock signal terminal;
a source electrode of the sixth transistor switch is coupled to the second input signal terminal; and
a drain electrode of the sixth transistor switch is coupled to the first node.

15. The shift register of claim 11, wherein:
the drive control circuit comprises a seventh transistor switch and a eighth transistor switch;
a gate electrode of the seventh transistor switch is coupled to the first node;
a source electrode of the seventh transistor switch is coupled to the reference signal terminal;
a drain electrode of the seventh transistor switch is coupled to the second node;
a gate electrode of the eighth transistor switch is coupled to the second node;
a source electrode of the eighth transistor switch is coupled to the reference signal terminal; and
a drain electrode of the eighth transistor switch is coupled to the first node.

16. The shift register of claim 15, wherein the drive control circuit further comprises a second capacitor between the second node and the second clock signal terminal.

17. A display apparatus, comprising a gate drive circuit including a plurality of shift registers, each shift register comprising:
a plurality of clock signal terminals;
a first input circuit configured to have input and reset functions;
a second input circuit configured to have input and reset functions and symmetric to the first input circuit to realize a function interchangeable with the first input circuit; and
a plurality of input terminals,
wherein the plurality input terminals are configured to provide input signals under control by one or more clock signals from one or more of the plurality of clock signal terminals to realize both a forward scan and a backward scan of the shift register by interchanging the input and reset functions of the first input circuit and the second input circuit.

18. The display apparatus of claim 17, wherein:
a first clock signal terminal of a 3m+1 stage shift register, a second clock signal terminal of a 3m+2 stage shift register, and a third clock signal terminal of a 3m+3 stage shift register are all coupled to a first clock signal terminal to receive a first clock signal;
a second clock signal terminal of the 3m+1 stage shift register, a third clock signal terminal of the 3m+2 stage shift register, and a first clock signal terminal of the 3m+3 stage shift register are all coupled to a second clock signal terminal to receive a second clock signal;
a third clock signal terminal of the 3m+1 stage shift register, a first clock signal terminal of the 3m+2 stage shift register, and a second clock signal terminal of the 3m+3 stage shift register are all coupled to a third clock signal terminal to receive a third clock signal;
m is an integral between 0 and (N/3−1), N is a total number of shift registers in the gate drive circuit;
the first clock signal, the second clock signal, and the third clock signal have a same width of clock cycle, and have a same effective duty cycle of ⅓; the first clock signal, the second clock signal, and the third clock signal are successively delayed for ⅓ width of the clock cycle during a forward scan; and the third clock signal, the second clock signal and the first clock signal are successively delayed for ⅓ width of the clock cycle during a backward scan.

19. A method for driving a shift register, the shift register comprising:
a plurality of clock signal terminals;
a first input circuit configured to have input and reset functions;
a second input circuit configured to have input and reset functions and symmetric to the first input circuit to realize a function interchangeable with the first input circuit; and
a plurality of input terminals; wherein:
the plurality input terminals are configured to provide input signals under control by one or more clock signals from one or more of the plurality of clock signal terminals to realize both a forward scan and a backward scan of the shift register by interchanging the input and reset functions of the first input circuit and the second input circuit;
the method comprising an input stage, an output stage, a reset stage, and a hold stage, wherein:
in the input stage, the first input circuit provides signals of the first input signal terminal to the first node under control of the first clock signal terminal; the drive control circuit provides signals of the reference signal terminal to the second node under control of the first node; and the first output circuit provide signals of the second clock signal terminal to the scan signal output terminal under control of the first node;
in the output stage, the drive control circuit provides signals of reference signal terminal to the second node under control of the first node; the first node is in a floating state; the first output circuit keeps a voltage difference between the first node and the scan signal output terminal stable, and provides signals of the second clock signal terminal to the scan signal output terminal under control of the first node; and
in the reset stage, the second input circuit provides signals of the second input signal terminal to the first node under control of the third clock signal terminal; the drive control circuit provides signals of the reference signal terminal to the second node under control of the first node; the first output circuit provides signals of the second clock signal terminal to the scan signal output terminal under control of the first node.

20. The method of claim 19, wherein:
in the hold stage, the second output circuit provides signals of the reference signal terminal to the scan signal output terminal under control of the first clock terminal.

\* \* \* \* \*